United States Patent
Faure et al.

(10) Patent No.: US 8,847,795 B2
(45) Date of Patent: Sep. 30, 2014

(54) DELAY-OPTIMIZED OVERLAP TRANSFORM, CODING/DECODING WEIGHTING WINDOWS

(75) Inventors: Julien Faure, Ploubezre (FR); Pierrick Philippe, Melesse (FR)

(73) Assignee: Orange, Paris (FR)

( * ) Notice: Subject to any disclaimer, the term of this patent is extended or adjusted under 35 U.S.C. 154(b) by 0 days.

(21) Appl. No.: 14/128,718

(22) PCT Filed: Jun. 26, 2012

(86) PCT No.: PCT/FR2012/051463
§ 371 (c)(1),
(2), (4) Date: Dec. 23, 2013

(87) PCT Pub. No.: WO2013/001226
PCT Pub. Date: Jan. 3, 2013

(65) Prior Publication Data
US 2014/0139362 A1    May 22, 2014

(30) Foreign Application Priority Data
Jun. 28, 2011 (FR) ..................... 11 55769

(51) Int. Cl.
| | |
|---|---|
| *H03M 7/00* | (2006.01) |
| *G10L 19/02* | (2013.01) |
| *H04L 27/26* | (2006.01) |
| *H03M 7/30* | (2006.01) |
| *G10L 19/12* | (2013.01) |
| *G10L 19/022* | (2013.01) |
| *H03M 7/46* | (2006.01) |
| *G10L 19/008* | (2013.01) |

(52) U.S. Cl.
CPC ............. *H03M 7/00* (2013.01); *H04L 27/26* (2013.01); *H03M 7/30* (2013.01); *G10L 19/0212* (2013.01); *G10L 19/12* (2013.01); *G10L 19/022* (2013.01); *H03M 7/46* (2013.01); *G10L 19/008* (2013.01); *H05K 999/99* (2013.01)
USPC ............................................. 341/50; 341/51

(58) Field of Classification Search
CPC .......... H03M 7/30; H03M 7/46; H04L 27/26; H05K 999/99; G10L 19/12; G10L 19/008
USPC ............ 341/50, 51, 55, 54, 63; 704/200, 203, 704/219, 500
See application file for complete search history.

(56) References Cited

U.S. PATENT DOCUMENTS 8,615,390 B2 * 12/2013 Kovesi et al. ................. 704/200

FOREIGN PATENT DOCUMENTS

WO    WO 2009/081003 A1    7/2009

* cited by examiner

*Primary Examiner* — Joseph Lauture
(74) *Attorney, Agent, or Firm* — Drinker Biddle & Reath LLP

(57) ABSTRACT

Coding/decoding of a digital signal, consisting of successive blocks of samples, the coding being of the transform with overlap type and comprising, upon analysis, the application of a weighting window to two blocks of M successive samples. In particular, this weighting window is asymmetric and comprises four distinct portions extending successively over the two aforesaid blocks, with: a first portion, increasing over a first interval of samples, a second portion, constant at a value of 1 over a second interval, a third portion, decreasing over a third interval, and a fourth portion, constant at a value of 0 over a fourth interval.

17 Claims, 5 Drawing Sheets

DELAY-OPTIMIZED OVERLAP TRANSFORM, CODING/DECODING WEIGHTING WINDOWS

CROSS-REFERENCE TO RELATED APPLICATIONS

This application is the U.S. national phase of the International Patent Application No. PCT/FR2012/051463 filed Jun. 26, 2012, which claims the benefit of French Application No. 1155769 filed Jun. 28, 2011, the entire content of which is incorporated herein by reference.

FIELD

The invention relates to the field of coding/decoding of digital audio signals, more specifically to the so-called field of "transform audio coding/decoding with overlap".

BACKGROUND

"Transform coding" consists in coding time-domain signals in the transform (frequency) domain. This transform notably makes it possible to use the frequency characteristics of the audio signals (music, speech, other) in order to optimize and enhance the coding efficiency. Use is, for example, made of the fact that a harmonic sound is represented in the frequency domain by a finite and reduced number of spectral rays which can thus be coded concisely. Use is also, for example, made advantageously of the frequency masking effects to format the coding noise in such a way that it is as inaudible as possible.

A standard transform coding technique is summarized as follows.

The digital audio stream (at a given sampling frequency Fs), to be coded, is cut up into frames (or, more generally "blocks") of finite numbers of samples 2M. Each frame conventionally overlaps the preceding frame to 50%. A weighting window $h_a$ (called "analysis window") is applied to each frame.

A transform is then applied to the signal. In the case of a transform called "MDCT" ("Modified Discrete Cosine Transform"), and in a particular embodiment, the weighted frame is "folded" according to a 2M samples to M samples transform. A DCT transform of IV type is then applied to the folded frame in order to obtain a frame of size M in the transformed domain.

The frame in the transformed domain is then quantized using a suitable quantizer. The quantization makes it possible to reduce the size of the data, but introduces a noise (audible or not) into the original frame. The higher the bit rate of the coder, the more this noise is reduced and the closer the quantized frame comes to the original frame.

Upon decoding, an inverse MDCT transform is then applied to the quantized frame. The quantized frame of size M is converted into a frame of size M in the time domain by using a DCT of inverse IV type. A second, M to 2M "unfolding" transform is then applied to the temporal frame of size M.

So-called "synthesis" weighting windows $h_s$ are then applied to the frames of sizes 2M.

The decoded audio stream is then synthesized by aggregating the overlapping parts.

For a synthesis window and a given overlap, an analysis window is determined which makes it possible to obtain a perfect reconstruction of the signal to be coded (in the absence of quantization).

A window conventionally used in transform coding is a window of sinusoidal type that is identical both in analysis and in synthesis. In this configuration, the minimum algorithmic delay introduced by the coding system is 2M/Fs seconds.

To reduce this delay, it is possible to impose zeros at the start of the synthesis window and at the end of the analysis window. Since the result of a multiplication of the signal by "0" is known in advance, it is possible to offset the frame rate relative to the position of the windows. These symmetrical windows, for example consist of:
- a certain number of zeros Mz which extend over an interval corresponding to the half of the algorithmic delay that is to be saved,
- a sinusoidal rising section of length M−2Mz,
- a section of 2Mz values at 1,
- the second half of the window finally being the symmetrical reflection of the first as illustrated in the appended FIG. 1.

These windows have an algorithmic delay of (2M−2Mz)/Fs seconds and thus make it possible to reduce the delay by 2Mz/Fs seconds.

However, such a technique, while it makes it possible to reduce the delay, does tend, when the reduction of the delay increases to resemble a rectangular window. Such a window form is not very frequency selective and ultimately drastically lowers the audio quality of the encoded signal. In addition, it greatly constrains the window because 4Mz samples are imposed in its construction. Not many degrees of freedom are available for proposing effective windows for the coding, notably to offer a significant frequency selectivity.

The document WO-2009/081003 has proposed using asymmetrical windows to mitigate this problem. These windows, from analysis, are made up of 0s only over the end of the analysis window. In order to limit the required storage space, the synthesis window is chosen to be the temporal reversal of the analysis window. This technique notably makes it possible to reduce the encoding delay, as well as the decoding delay. For a total number of zeros Mz two times lower than that of the symmetrical windows previously described, the delay gain is the same. Given the reduced number of zeros, the frequency selectivity of such asymmetrical windows is greater than that of the symmetrical windows. The audio quality of the decoded signal is thereby enhanced.

More particularly, document WO-2009/081003 presents an analysis window $h_a(n)$ made up of two parts ha1 and ha2 from an initial window h(n) given by:

$$h(n) = \sin\left[\frac{\pi}{2M - M_z}\left(n + \frac{1}{2}\right)\right]$$

for $$0 \leq n < 2M - M_z$$

and h(n)=0 otherwise (that is to say, for $2M-M_z \leq n < 2M$) and a correction factor Δ(n) making it possible to have the perfect reconstruction condition, given by:

$$\Delta(n) = \sqrt{h(n)h(2M-1-n)+h(n+M)h(M-1-n)}$$

The analysis window $h_a$ is given by:

$$h_{a1}(n+M)=h(n+M)/\Delta(n) \text{ and } h_{a2}(n)=h(n)/\Delta(n)$$

for $0 \leq n < M$

The synthesis window $h_s(n)$ is the temporal reversal of the analysis window:

$$h_s(2M-1-n)=h_a(n), \text{ for } 0 \leq n < 2M$$

Such windows are, for one and the same delay gain, of better quality than symmetrical windows because of their better frequency selectivity.

However, even if the prior art is advantageous and proposes an enhancement of the quality compared to the preceding techniques, when a solution is sought with a more significant delay gain, with, for example, a number of zeros Mz greater than M/4 (where M is a frame duration), an audible degradation is observed, by applying such windows, which can notably be explained by the fact that a portion of the window takes high values, much greater than 1, as illustrated in FIG. 2. Now, it is generally preferable, in digital signal processing, to use weightings with values less than 1 as an absolute value because of the fixed point implementation.

SUMMARY

The present invention improves the situation.

To this end, it proposes a method for coding a digital signal made up of successive blocks of samples, the coding being of the transform with overlap type and comprising, upon analysis, the application of a weighting window over two successive blocks of M samples. In particular, the abovementioned weighting window is asymmetrical and comprises four distinct portions extending in succession over the two blocks, with:
- a first portion, increasing over a first interval of samples,
- a second portion, constant at a value of 1 over a second interval,
- a third portion, decreasing over a third interval, and
- a fourth portion, constant at a value of 0 over a fourth interval.

As will be seen later, according to one of the advantages obtained through the invention, the constancy of the window at 1 during the second interval makes it possible to reduce the complexity of the use of the windows of the prior art as described in document WO-2009/081003, while retaining its low delay advantages and also enhancing the quality of the audio rendition, as will be seen later with reference to FIG. 3.

Moreover, it is advantageous for the first, second and third intervals to be calculated at least as a function of the duration of the fourth interval (number of 0s at the end of the window), which sets the abovementioned delay, which can advantageously be rounded to an algorithmic delay as will be seen in the exemplary embodiments hereinbelow. Similarly, the rising and falling edges of the respectively increasing and decreasing portions can be optimized as a function notably of the duration of the fourth interval. The fourth interval (hereinafter denoted Mz) is self-expressed as a function of the number of samples M per block, and, of course, as a function of the desired maximum delay.

The succession of the analysis windows exhibits characteristics similar to that described in the abovementioned document WO-2009/081003. In particular, two blocks of samples of the same size 2M, being weighted respectively by a first and a second analysis window, the rising edge of the second window can be different from the falling edge of the temporally reversed first window. These edges are not therefore a priori symmetrical.

Moreover, in the implementation of the invention, upon coding, a number of identical analysis windows having the abovementioned characteristics (rise, constancy at 1, descent and constancy at 0) can be applied successively to a plurality of successive blocks of 2M samples, overlapping by M samples, as illustrated in FIG. 10. In generic terms, the method of the invention then includes the application of a plurality of successive windows, asymmetrical and comprising the abovementioned four portions, to a succession of pairs of blocks. Thus, as in the document WO-2009/081003, here again, no particular transition window is provided when the asymmetrical window is applied.

In a particular embodiment, the window varies over the first interval, denoted $R_1$, as a function $w_1$ of type:

$$w_1(n) = \frac{W_1(n)}{\Delta_n(n)},$$

with $$W_1(n) = \sin\left(\frac{\pi}{2}\frac{n+1}{R_1}\right)^{C_1}$$

and:

$\Delta_n(n) = \sqrt{h_i(n) \cdot h_i(2M-n-1) + h_i(n+M) \cdot h_i(M-n-1)}$, $n \in [0; M-1]$
with $C_1$ and $R_1$, constants greater than 0.

By optimization for example, it is found that the term $C_1$ can be between 3 and 5, for a range of delays of the order of 15 to 30 ms. In a particular exemplary embodiment, $C_1 = 4.8425$.

The first interval, denoted $R_1$, is, in this exemplary embodiment, of a duration given by:

$$R_1 \left\lfloor \frac{2M \times 404}{1280} + 0.5 \right\rfloor,$$

in which M corresponds to the duration of a block, the notation $\lfloor x \rfloor$ designating the integer less than or equal to x and closest to x.

With respect to the second portion of the window, the latter can vary, in an exemplary embodiment, over the third interval, denoted $R_2$, as a function $w_3$ of type:

$$w_3(n) = \frac{W_3(n)}{\Delta_n(n)},$$

with $$W_3(n) = \cos\left(\frac{\pi}{2}\frac{n}{R_2}\right)^{C_2},$$

and:

$\Delta_n(n) = \sqrt{h_i(n) \cdot h_i(2M-n-1) + h_i(n+M) \cdot h_i(M-n-1)}$, $n \in [0; M-1]$
with $C_2$ and $R_2$, constants greater than 0.

According to optimization tests carried out, the term $C_2$ is preferentially between 0.85 and 1.05 and in the particular exemplary embodiment, $C_2 = 0.9659$.

The third interval, denoted $R_2$, is, in this exemplary embodiment, of a preferential duration given by:

$$R_2 = \left\lfloor \frac{2M \times 196}{1280} + 0.5 \right\rfloor,$$

in which M corresponds to the duration of a block, the notation $\lfloor x \rfloor$ designating the integer less than or equal to x and closest to x.

In this exemplary embodiment, the fourth interval, denoted $M_z$, is chosen initially such that it is of a duration given by $$M_z = \left\lceil \frac{2M \times 7}{40} \right\rceil$$

in which the notation $\lfloor x \rfloor$ designates the integer greater than or equal to x and closest to x, M corresponding to the duration of a block.

Of course, other delays can be implemented and thus other durations of the fourth interval Mz can be provided. Table 1 given in the exemplary embodiments detailed hereinbelow indicates values of the parameters $C_1$, $C_2$, and of the intervals $R_1$, $R_2$, for different delay values and therefore for different fourth interval durations Mz.

Thus, the method can advantageously include a preliminary step of optimization of the form of the window, this optimization being based on at least one cost function estimation, to arrive at the optimum parameters $C_1$, $C_2$, and/or even $R_1$, $R_2$ described above.

Overall, it is advantageous for the total number of "1" in the window to be approximately two times greater than the number of 0, according to the optimizations made, notably for a good quality audio rendition.

Thus, in another particular exemplary embodiment, the first interval, denoted $R_1$, is, for example, of a duration given by:

$R_1 = \lfloor M - M_z + 1 + 0.5 \rfloor$, in which M corresponds to the duration of a block, and $M_z$ corresponds to the duration of the fourth interval.

In this example, the third interval $R_2$ can be of a duration given by:

$R_2 = \lfloor M - 2M_z + 1 + 0.5 \rfloor$, in which M corresponds to the duration of a block, and $M_z$ corresponds to the duration of the fourth interval.

Table 2 given in the exemplary embodiments detailed hereinbelow indicates values of the parameters $C_1$ and $C_2$, when the intervals $R_1$ and $R_2$ have been thus set, for different delay values and therefore for different fourth interval durations Mz.

Thus, the invention proposes, on a principle of asymmetrical window with perfect reconstruction with a chosen number of zeros of the type presented in the document WO-2009/081003, the use of optimized analysis and synthesis windows, which make it possible to have good sound rendition, while ensuring an effective implementation. FIG. 3 illustrates a comparison of the performances in terms of audio quality between a window according to the invention (reference INV), a window according to document WO-2009/081003 (reference AA) and a conventional sinusoidal window (SIN) for a 26 ms delay. The other points, unreferenced, relate to other prior art techniques. It appears that the invention makes it possible to conserve an audio quality equivalent to that achieved with conventional windows (SIN), while offering a delay gain comparable to that achieved by the implementation described in the document WO-2009/081003. The perceptual quality is then retained in the description below as assessment criterion, an error of reconstruction of the transform remaining negligible, in perception terms, in relation to a predetermined perception threshold.

The present invention targets a method for decoding a digital signal, coded by the implementation of the above method, the decoding being of the transform with overlap type and comprising, upon synthesis, the application of a weighting window over two successive blocks of coded samples. In particular, the weighting window, upon synthesis, is identical to the analysis window used in the coding, temporally reversed, for example to ensure a perfect reconstruction property, as will be seen later.

The present invention also targets a computer program intended to be stored in memory of a coding or decoding device and comprising in particular instructions for the implementation of the above coding method or of the abovementioned decoding method, when the instructions are executed by a processor of the device. In particular, it can be a computer program, comprising a first part specific to the coding and a second part specific to the decoding. FIG. 7, described later, is an example of a flow diagram of the general algorithm of such a program and FIG. 8 illustrates preliminary steps that, in a particular embodiment, the algorithm of this program, in particular can include, particularly if this program comprises instructions for the prior construction of the analysis and synthesis windows that the coding/decoding methods according to the invention use.

As represented schematically in FIG. 9, the present invention also targets a signal coding device COD, comprising means for storing MEM and/or computing μP data of an analysis weighting window, for the implementation of the coding method according to the invention. Similarly, the present invention also targets a signal decoding device DECOD, comprising means for storing MEM' and/or computing μP data of a synthesis weighting window, for the implementation of the decoding method according to the invention. It is possible in particular, for both coding and decoding, to start from pre-initialized analysis and/or synthesis window values (stored in memories MEM and/or MEM'), and possibly to optimize these values on the fly (by the implementation of the computation means μP).

BRIEF DESCRIPTION OF THE DRAWINGS

Other advantages and features of the invention will become apparent on reading the detailed description, given below by way of examples of nonlimiting embodiments, and the appended drawings in which.

DETAILED DESCRIPTION

Figure 6:
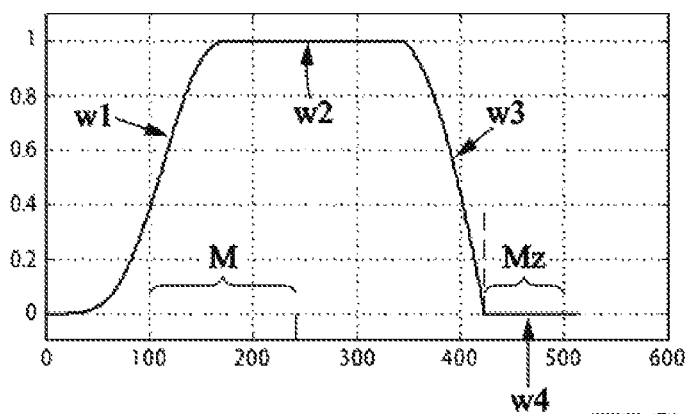
FIG. 6 illustrates an exemplary analysis window according to the invention, obtained from an initialization window of the type represented in FIG. 5, FIG. 7 schematically represents the steps of an exemplary transform coding/decoding method, to illustrate the context of the present invention, FIG. 8 schematically represents the steps of an exemplary construction of the analysis and synthesis windows for an implementation of the method according to the invention, FIG. 9 schematically represents coding and decoding devices for the implementation of the invention.
Figure 7:
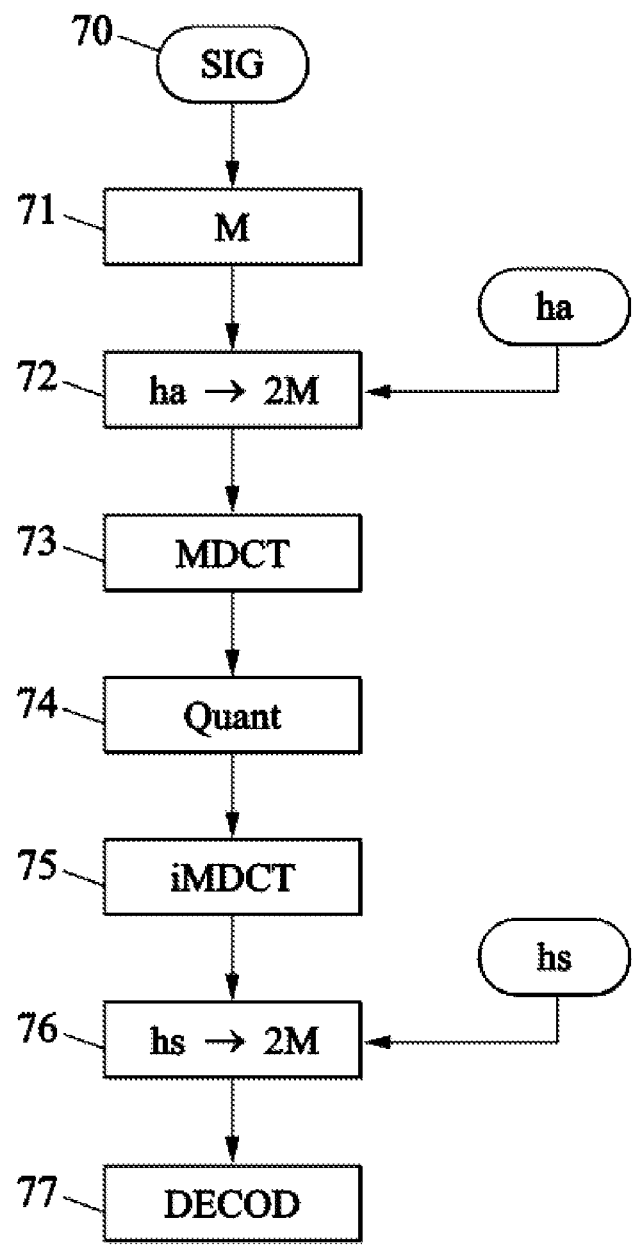

Reference is first made to FIG. 7 to describe, as general framework for the implementation of the invention, a method for coding/decoding a digital signal (given at step 70), by transform with overlap. The method comprises a step 71 of dividing up the digital audio signal into frames of length M. Then, each frame is grouped with the preceding one, which corresponds to an overlap of 50%. In the next step 72, an analysis window $h_a$ is applied to this set of two frames. FIG. 6 illustrates an exemplary analysis window $h_a$ according to the invention (amplitude from 0 to 1 as a function of the number of samples "Nb Ech"). It will be noted that the analysis window $h_a$ ends with Mz values at 0 and is of total length 2M.

The next step 73 consists in applying a transform, for example of MDCT type, to the block of two frames thus weighted by the window $h_a$, then in quantizing (step 74) the values in the transform domain.

Upon decoding, an inverse transform makes it possible, in the step 75, to reconvert the values into the time domain. If the transform upon coding is, for example, of MDCT type, an inverse transform iMDCT can be applied upon decoding.

In the step 76, to ensure a condition of perfect reconstruction, a synthesis window $h_s$ is applied to the two decoded frames. As described in document WO-2009/081003, this condition imposes a correction factor $1/\Delta_n$ (described in detail hereinbelow) applied to an initialization window $h_i$ to obtain the analysis window $h_a$. The synthesis window $h_s$ appears as the temporal reversal of the analysis window $h_a$, with:

$$h_s(n) = h_a(2M-n-1)$$

In the step 77, the blocks which overlap are aggregated, to finally deliver the decoded signal, assuring a perfect reconstruction thereof.

Reference is now made again to FIG. 6, to describe in more detail the appearance of the analysis window $h_a$ used in such a method, in particular in the coding. The analysis window is made up of four distinct segments w1, w2, w3, w4. The same applies to the synthesis window $h_s$ which appears as the temporal reversal of the analysis window.

Over a first interval hereinbelow denoted $R_1$, the analysis window varies as a function $w_1$ of type:

$$w_1(n) = \frac{W_1(n)}{\Delta_n(n)},$$

with $$W_1(n) = \sin\left(\frac{\pi}{2}\frac{n+1}{R_1}\right)^{C_1},$$

and:

$$\Delta_n(n) = \sqrt{h_i(n).h_i(2M-n-1)+h_i(n+M).h_i(M-n-1)}, n \in [0;M-1]$$

Then, the analysis window is constant and has the value w2=1 over a second interval.

Over a third interval hereinbelow denoted $R_2$, the window varies as a function $w_3$ of type:

$$w_3(n) = \frac{W_3(n)}{\Delta_n(n)},$$

with $$W_3(n) = \cos\left(\frac{\pi}{2}\frac{n}{R_2}\right)^{C_2},$$

and:

$$\Delta_n(n) = \sqrt{h_i(n).h_i(2M-n-1)+h_i(n+M).h_i(M-n-1)}, \text{ with:}$$

$$n \in [0;M-1]$$

Finally, over a fourth interval Mz, the analysis window is constant and has the value w4=0.

It is shown hereinbelow that, compared to the prior art WO-2009/081003, the form of such windows makes it possible to ensure an optimum audio quality for a significant delay gain (possibly ranging for example up to 40%). The use of such windows (of general variations: increasing, constant at 1, decreasing and constant at 0) is not limited to one type of transform MDCT. They can also be used for example in the case where the coding only relates solely to only a part of the signal to be coded (for example a part of the audio band only, for example to process a coding error compared to another coding technique, or other).

Figure 8:
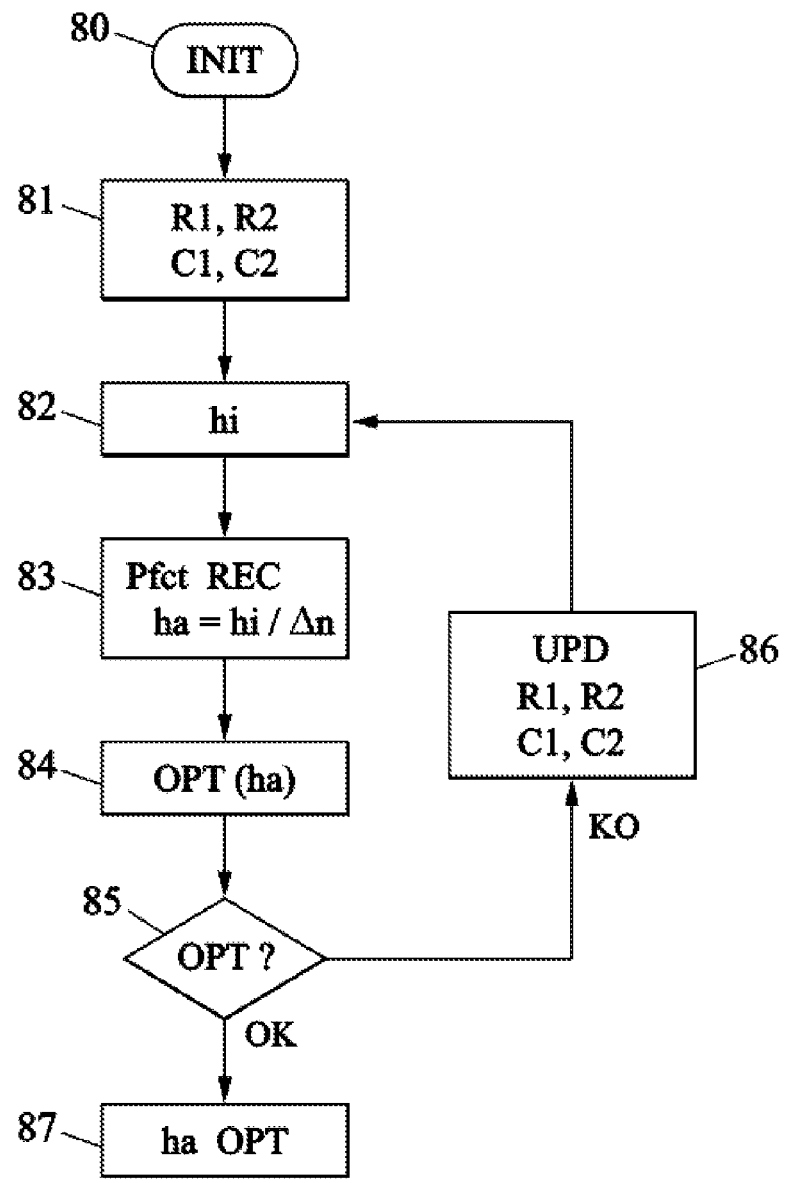
Figure 9:
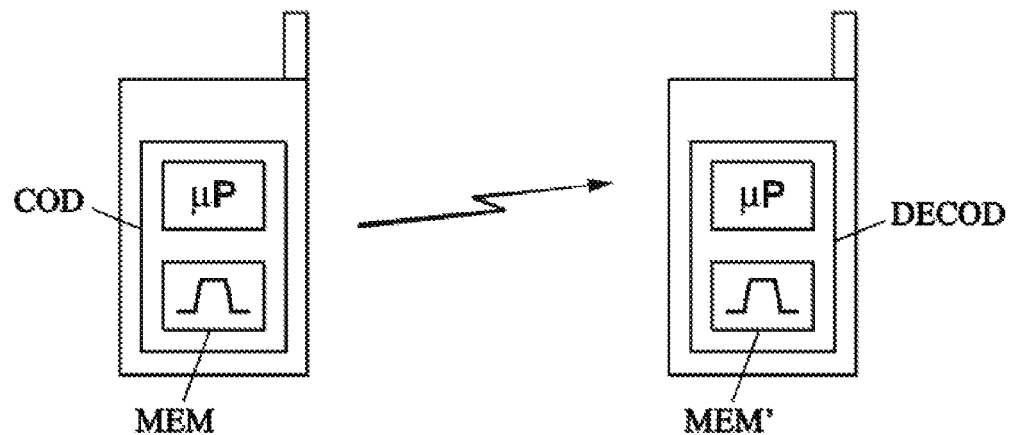
Figure 10:
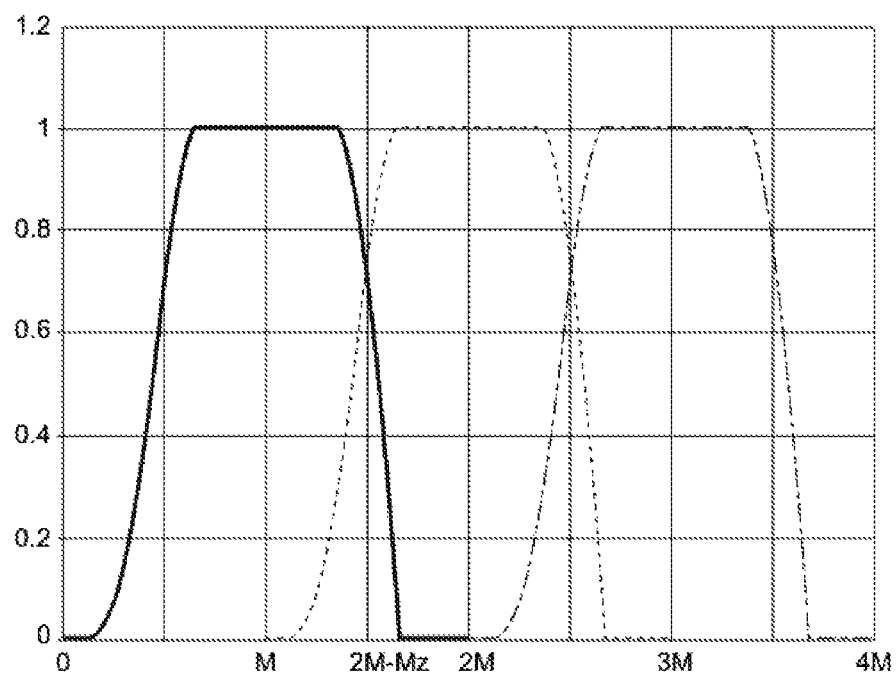
FIG. 10 illustrates a succession of analysis windows according to the invention, applied with overlap.

There now follows a description with reference to FIG. 8, of how the window $h_a$, used in a method as described above with reference to FIG. 7, is obtained.

Figure 4:
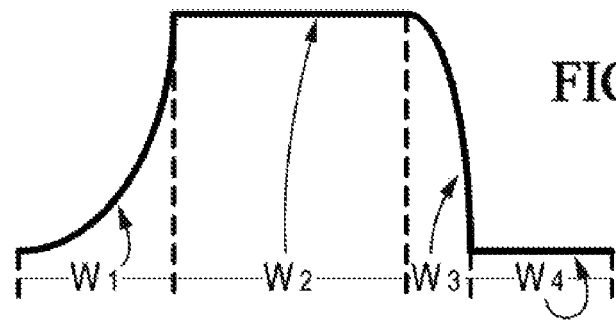
FIG. 4 illustrates a first exemplary initialization window $h_i$ for the construction of an analysis window according to the invention.
Figure 5:
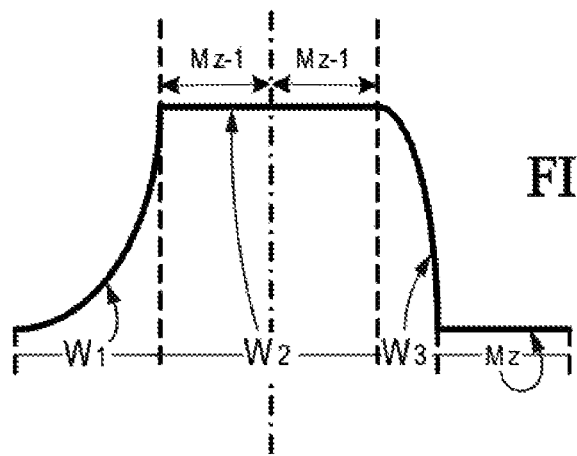
FIG. 5 illustrates a second exemplary initialization window $h_i$ for the construction of an analysis window according to the invention.

Following an initialization step 80, initialization parameters $R_1, R_2, C_1$ and $C_2$ are defined in step 81. In the next step 82, an initialization window $h_i$ is calculated from these initialization parameters. As illustrated in FIGS. 4 and 5, this initialization window hi is made up of four segments $W_1, W_2, W_3, W_4$.

The first segment $W_1$ of length $R_1$ is defined by the equation:

$$W_1(n_1) = \sin\left(\frac{\pi}{2}\frac{n_1+1}{R_1}\right)^{C_1}, n_1 \in [0; R_1 - 1]$$

in which $C_1$ is a constant >0.

The second segment $W_2$ of length $L=2M-R_1-R_2-M_z$ is made up of values at 1.

The third segment $W_3$ of length $R_2$ is defined by the equation:

$$W_3(n_2) = \cos\left(\frac{\pi}{2}\frac{n_2}{R_2}\right)^{C_2}, n_2 \in [0; R_2 - 1]$$

in which $C_2$ is a constant >0.

The fourth segment $W_4$ of length $M_z$ is made up of values all at 0.

The initialization window $h_i(n)$ is therefore given by:

$$h_i(n) = \begin{cases} W_1(n) & \text{for } n \in [0; R_1 - 1] \\ 1 & \text{for } n \in [R_1; 2M - R_2 - M_z - 1] \\ W_3(n - 2M + R_2 + M_z) & \text{for } n \in [2M - R_2 - M_z; 2M - M_z - 1] \\ 0 & \text{for } n \in [2M - M_z; 2M - 1] \end{cases}$$

In the step 83, a factor $1/\Delta_n$ is applied to the initialization window $h_i$, which makes it possible to ensure a condition of perfect reconstruction, and do so on the assumption that the synthesis window is the temporal reversal of the analysis window and that the transform upon decoding will be dual (for example an iMDCT transform, if an MDCT transform was applied on coding).

The term $\Delta_n$ is given by:

$$\Delta_n(n) = \Delta_n(n+M) = \sqrt{h_i(n) \cdot h_i(2M-n-1) + h_i(n+M) \cdot h_i(M-n-1)}$$

$$n \in [0; M-1]$$

The analysis window $h_a$ with perfect reconstruction is then given by $$h_a(n) = \frac{h_{i(n)}}{\Delta_n(n)}, n \in [0; 2M-1]$$

It will be noted that the values strictly at "1" do not require any weighting multiplication. Thus, the expected gain in complexity is significant compared to the prior art, as the table below shows, according to another advantage that is obtained through the invention.

Figure 1:
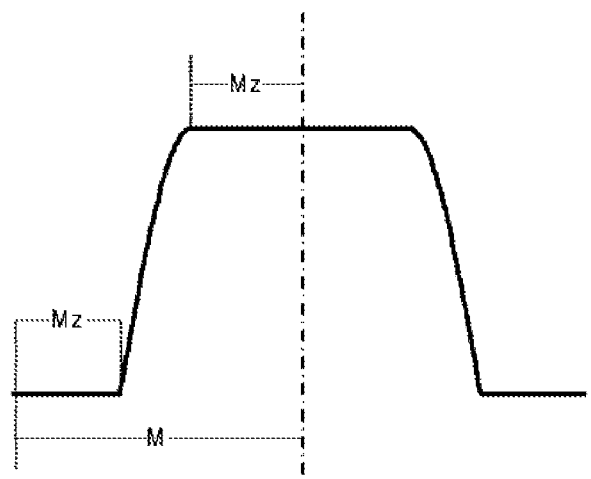
FIG. 1 illustrates the appearance of a conventional symmetrical window with low delay, comprising zeros at the start and end of the window.
Figure 2:
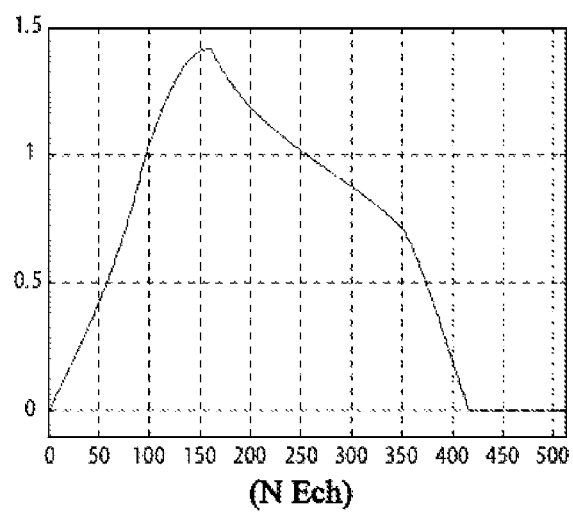
FIG. 2 illustrates the appearance of an asymmetrical window as described in document WO-2009/081003, with a delay gain of 15 ms for a frame 2M of 40 ms.
Figure 3:
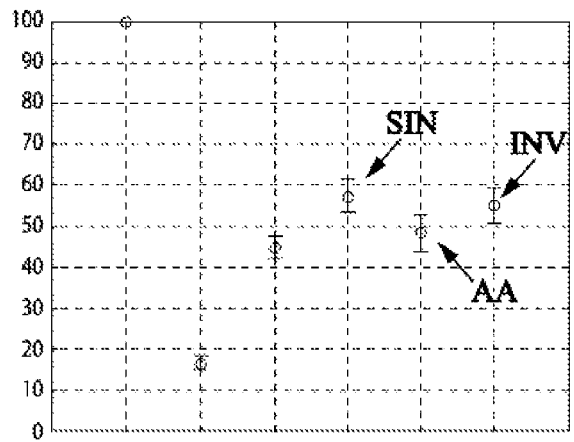
FIG. 3 illustrates a comparison of the audio quality between a window according to the invention INV, a sinusoidal window SIN according to FIG. 1, and a window AA according to FIG. 2, for a delay of 26 ms.

| Window (512 points) | Number of multiplications | Gain |
|---|---|---|
| Window SIN of FIG. 1 | 512 | 0% |
| Window AA of FIG. 2 | 416 | 19% |
| Window INV of FIG. 6 | 224 | 56% |

Thus, for a given delay gain (a given number Mz of zeros), there is an optimum combination of the four parameters $R_1$, $R_2$, $C_1$, $C_2$ defining the precise form of the analysis and synthesis windows that makes it possible to have the best possible audio quality. These parameters can be obtained by optimization with successive iterations, as described later with reference once again to FIG. 8.

For example, a delay gain of 35% (corresponding to 14 ms for 40 ms frames in the example described here), corresponds simply to an algorithmic delay of the coder. This delay, of 26 ms in the example described, imposes a number of zeros $M_z$ given by:

$$M_z = \left\lceil \frac{2M \times 7}{40} \right\rceil$$

in which $\lceil x \rceil$ denotes the integer greater than or equal to x that is closest to x. It is then found that Mz=14 ms, for M=40 ms.

With this choice, the values of the parameters of the analysis and synthesis windows can, for example, be given by:

$$R_1 = \left\lfloor \frac{2M \times 404}{1280} + 0.5 \right\rfloor$$

$$R_2 = \left\lfloor \frac{2M \times 196}{1280} + 0.5 \right\rfloor$$

$$C_1 = 4.8425$$

$$C_2 = 0.9659$$

in which $\lfloor x \rfloor$ denotes the integer less than or equal to x that is closest to x.

Such an embodiment corresponds to the initialization window represented in FIG. 4.

Another exemplary approach makes it possible to reduce the number of parameters of the initialization window to be sought. This approach consists in considering that the number of "1" in the window $h_i$ should be twice the number of "0" and that the axis of symmetry of the window $h_i$ corresponds to the middle of the segment $W_2$, as illustrated in FIG. 5. In these conditions, the values of the intervals $R_2$ and $R_1$ depend only on the extent of the interval Mz (that is to say, on the chosen number of "0" at the end of the initialization window).

In these conditions:

$$M_z = \left\lceil \frac{2M \times \frac{G_{delay}}{2}}{FL} \right\rceil$$

$$R_2 = \lfloor M - 2M_z + 1 + 0.5 \rfloor$$

$$R_1 = \lfloor M - M_z + 1 + 0.5 \rfloor$$

in which $G_{delay}$ is the desired gain on the delay, in ms, FL is the length of the frame 2M in ms (the sampling frequency being given by Fs=2M/FL×1000, if counting in milliseconds or "ms").

Then, in the step 84 of FIG. 8 efforts are made to determine the constants $C_1$ and $C_2$ (and possibly $R_1$ and $R_2$), for example by the implementation of an iterative optimization (such as, for example, the so-called "gradients" technique).

Starting, for example, at the step 81 with a choice of initial parameters for the values of $R_1$; $R_2$; $C_1$ and $C_2$, respectively of 2Mz; Mz; 1 and 1, a cost function is calculated in step 84 that is applied to:

the analysis window devolving from the initialization window having a form of the type described above, and
its synthesis dual, ensuring a perfect reconstruction.

The cost function can be made up of a set of criteria to be verified in the test 85. Examples that can be cited in a non-limiting manner include:

the analysis of the first derivative of the window:

$$D1 = \log 10 \left( \frac{1}{2M} \sum_{n=0}^{n=2M-1} D'(n) \right)$$

with $$D'(n) = \begin{cases} |W(0)| & \text{if } n = 0 \\ |W(n+1) - W(n)| & \text{if } 0 < n < 2M - 1 \\ |W(2M-1)| & \text{if } n = 2M - 1 \end{cases}$$

the analysis of the second derivative of the window:

$$D2 = \log 10 \left( \frac{1}{2M} \sum_{n=0}^{n=2M-1} D''(n) \right)$$

with $$D''(n) = \begin{cases} D'(0) & \text{if } n = 0 \\ |D'(n+1) - D'(n)| & \text{if } 0 < n < 2M - 1 \\ |D'(2M-1)| & \text{if } n = 2M - 1 \end{cases}$$

the coding gain search as defined for example in document WO-2009/081003,
the maximization of the signal-to-noise ratio "SNR", expressed as a logarithm between a non-coded signal and the error introduced by the coding, for a given audio sample by applying both the analysis window and the synthesis window according to the invention.

In the test 85, it is possible to check whether the end of optimization criteria are reached (cost function value, variation of the value of the parameters, or other). If appropriate (OK arrow), the optimized parameter values are found in the end step 87. Otherwise, in the contrary case (KO arrow), the values of $R_1$, $R_2$, $C_1$ and $C_2$ are modified in such a way as to reduce the cost function.

Thus, by starting from a choice of initial parameters $R_1$; $R_2$; $C_1$ and $C_2$ respectively at 2Mz; Mz; 1 and 1, it is found that, after optimization:

$$R_1 = \left\lfloor \frac{2M \times 404}{1280} + 0.5 \right\rfloor$$

$$R_2 = \left\lfloor \frac{2M \times 196}{1280} + 0.5 \right\rfloor$$

$$C_1 = 4.8425$$

$$C_2 = 0.9659$$

if the option is taken to optimize all these four parameters, or, alternatively:

$C_1$ with a value close to 5, and
$C_2$ with a value close to 1, if the option is taken not to optimize only the two parameters $C_1$ and $C_2$.

It is therefore possible, in this second option, to limit the search for optimum values to $C_1$ and $C_2$ in the case where it is assumed that the number of 1 is twice the number of 0 and that the axis of symmetry of the window corresponds to the middle of the segment $W_2$ as illustrated in FIG. 5.

It should be noted that, with the abovementioned first option (optimizing all four parameters), for a delay of 28 ms (instead of 26 ms as previously), it is found that $C_1$=4.1582 and $C_2$=0.9181 with this optimization technique.

More generally, table 1 below presents a set of optimized parameters $R_1$, $R_2$, $C_1$ and $C_2$, according to different delay options and therefore number of "0" samples (Mz). The number of samples per frame M is given for a 48 000 Hz sampling frequency and 20 ms frames:

TABLE 1

Optimization of all four parameters $R_1$, $C_1$, $R_2$, $C_2$

| Delay (ms) | M | Mz | $R_1$ | $R_2$ | $C_1$ | $C_2$ |
|---|---|---|---|---|---|---|
| 26 | 960 | 336 | 404 * M/640 = 606 | 196 * M/640 = 294 | 4.8425 | 0.9659 |
| 28 | 960 | 288 | M − Mz = 672 | M − 2 * Mz = 384 | 4.1582 | 0.9181 |
| 30 | 960 | 240 | 480 * M/640 = 720 | 320 * M/640 = 480 | 3.8945 | 0.8502 |
| 26 | 960 | 336 | 398 * M/640 = 597 | 190 * M/640 = 285 | 5.0304 | 0.9777 |

The data of this table are expressed in particular as a function of the number of "0" samples in the fourth interval Mz, as follows:

| Delay (ms) | M | Mz | $R_1$ | $R_2$ | $C_1$ | $C_2$ |
|---|---|---|---|---|---|---|
| 26 | 960 | 336 | 404 * (20/7) * Mz/640 = 606 | 196 * (20/7) * Mz/640 = 294 | 4.8425 | 0.9659 |
| 28 | 960 | 288 | M − Mz = 672 | M − 2 * Mz = 384 | 4.1582 | 0.9181 |
| 30 | 960 | 240 | M − Mz = 720 | M − 2 * Mz = 480 | 3.8945 | 0.8502 |
| 26 | 960 | 336 | 398 * (20/7) * Mz/640 = 597 | 190 * (20/7) * Mz/640 = 285 | 5.0304 | 0.9777 |

Table 2 below presents a set of parameters $C_1$ and $C_2$ optimized, according to the abovementioned second option, by setting the intervals $R_1$ and $R_2$ as a function of the number of zeros Mz. The number of samples per frame M is given for a 48 000 Hz sampling frequency and 20 ms frames:

TABLE 2

Optimization of the two parameters $C_1$ and $C_2$, after setting the intervals $R_1$ and $R_2$

| Delay (ms) | M | Mz | $R_1$ = M − Mz + 1 | $R_2$ = M − 2 * Mz + 1 | $C_1$ | $C_2$ |
|---|---|---|---|---|---|---|
| 26 | 960 | 336 | 625 | 289 | 4.4265 | 1.0256 |
| 28 | 960 | 288 | 673 | 385 | 4.1406 | 0.9163 |
| 30 | 960 | 240 | 721 | 481 | 3.7382 | 0.8699 |

Of course, the present invention is not limited to the embodiment described above as an example; it extends to other variants.

For example, the method of optimization by iteration can, as described above, be a method of the so-called "gradients" type but other variants are, of course, possible. It is also possible, for example, within the optimization process, to set the maximum of the window $h_a$ to 1, so as to process the sound samples with a relatively constant weight.

More generally, the values of the analysis and synthesis windows can be determined beforehand (by optimization as described above), then hard-stored in a memory of a coding or decoding device, to be used in a coding or decoding method. In a variant, it is possible to define initialization windows, store them in memory of the abovementioned devices and then optimize them, for example, according to the communication conditions.

The invention claimed is:

1. A method for coding a digital signal, said signal being made up of successive blocks of samples, the coding being of the transform with overlap type and comprising, upon analysis, the application of a weighting window over two successive blocks of M samples, wherein said weighting window is asymmetrical and comprises four distinct portions extending in succession over said two blocks, with:

a first portion, increasing over a first interval of samples,
a second portion, constant at a value of 1 over a second interval,
a third portion, decreasing over a third interval, and
a fourth portion, constant at a value of 0 over a fourth interval.

2. The method as claimed in claim 1, wherein the first, second and third intervals are calculated at least as a function of the fourth interval.

3. The method as claimed in claim 1, wherein the window varies over the first interval, denoted $R_1$, as a function $w_1$ of type:

$$w_1(n) = \frac{W_1(n)}{\Delta_n(n)}, \text{ with } W_1(n) = \sin\left(\frac{\pi}{2}\frac{n+1}{R_1}\right)^{C_1}$$

and:

$\Delta_n(n) = \sqrt{h_t(n) \cdot h_t(2M-n-1) + h_t(n+M) \cdot h_t(M-n-1)}$, $n \in [0; M-1]$ with $C_1$ and $R_1$, constants greater than 0.

4. The method as claimed in claim 3, wherein the term $C_1$ is between 3 and 5.

5. The method as claimed in claim 3, wherein the first interval, denoted $R_1$, is of a duration given by:

$$R_1 = \left\lfloor \frac{2M \times 404}{1280} + 0.5 \right\rfloor,$$

in which M corresponds to the duration of a block, the notation $\lfloor x \rfloor$ designating the integer less than or equal to x and closest to x.

6. The method as claimed in claim 1, wherein the window varies over the third interval, denoted $R_2$, as a function $w_3$ of type:

$$w_3(n) = \frac{W_3(n)}{\Delta_n(n)}, \text{ with } W_3(n) = \cos\left(\frac{\pi}{2}\frac{n}{R_2}\right)^{C_2},$$

and:

$\Delta_n(n) = \sqrt{h_t(n) \cdot h_t(2M-n-1) + h_t(n+M) \cdot h_t(M-n-1)}$, $n \in [0; M-1]$ with $C_2$ and $R_2$, constants greater than 0.

7. The method as claimed in claim 5, wherein the term $C_2$ is between 0.85 and 1.05.

8. The method as claimed in claim 5, wherein the third interval, denoted $R_2$, is of a duration given by:

$$R_2 = \left\lfloor \frac{2M \times 196}{1280} + 0.5 \right\rfloor,$$

in which M corresponds to the duration of a block, the notation $\lfloor x \rfloor$ designating the integer less than or equal to x and closest to x.

9. The method as claimed in claim 1, wherein the duration of the fourth interval, denoted $M_z$, is chosen to be:

$$M_z = \left\lceil \frac{2M \times 7}{40} \right\rceil$$

in which the notation $\lceil x \rceil$ designates the integer greater than or equal to x and closest to x, M corresponding to the duration of a block.

10. The method as claimed in claim 1, wherein the first interval, denoted $R_1$, is of a duration given by:
$R_1 = \lfloor M - M_z + 1 + 0.5 \rfloor$, in which M corresponds to the duration of a block, and $M_z$ corresponds to the duration of the fourth interval.

11. The method as claimed in claim 10, wherein the third interval, denoted $R_2$, is of a duration given by:
$R_2 = \lfloor M - 2M_z + 1 + 0.5 \rfloor$, in which M corresponds to the duration of a block, and $M_z$ corresponds to the duration of the fourth interval.

12. The method as claimed in claim 1, comprising the application of a plurality of successive windows, asymmetrical and comprising said four portions, to a succession of pairs of blocks.

13. A method for decoding a digital signal, coded by the implementation of the method as claimed in claim 1, the decoding being of the transform with overlap type and comprising, upon synthesis, the application of a weighting window over two successive blocks of coded samples, wherein said weighting window, upon synthesis, is identical to the analysis window used in the coding, temporally reversed.

14. A signal decoding device, comprising means for storing and/or computing data of a synthesis weighting window, for the implementation of the decoding method as claimed in claim 13.

15. A computer readable medium storing instructions of a computer program intended to be stored in memory of a coding or decoding device, comprising instructions for the implementation of the decoding method as claimed in claim 13, when the instructions are executed by a processor of the device.

16. A computer readable medium storing instructions of a computer program intended to be stored in memory of a coding or decoding device, comprising instructions for the implementation of the coding method as claimed in claim 1, when the instructions are executed by a processor of the device.

17. A signal coding device, comprising means for storing and/or computing data of an analysis weighting window, for the implementation of the coding method as claimed in claim 1.

* * * * *